United States Patent

Björklund

[19]

[11] Patent Number: 5,903,155
[45] Date of Patent: May 11, 1999

[54] METHOD OF MEASUREMENT FOR FAULT-DISTANCE DETERMINATION ON A HVDC POWER TRANSMISSION LINE HAVING AT LEAST TWO LINES CONNECTED IN PARALLEL

[75] Inventor: Hans Björklund, Ludvika, Sweden

[73] Assignee: Asea Brown Boveri AB, Vasteras, Sweden

[21] Appl. No.: 08/917,621

[22] Filed: Aug. 26, 1997

[30] Foreign Application Priority Data

Aug. 29, 1996 [SE] Sweden ................................. 9603129

[51] Int. Cl.[6] .................................................. G01R 31/08
[52] U.S. Cl. ............................ 324/522; 324/535; 324/531
[58] Field of Search ................................ 324/512, 522, 324/527, 528, 532, 535, 539, 543; 361/81; 702/59

[56] References Cited

U.S. PATENT DOCUMENTS

| | | | |
|---|---|---|---|
| 3,609,533 | 9/1971 | Pardis ........................................ | 324/535 |
| 3,670,240 | 6/1972 | Maranchak et al. ...................... | 324/535 |
| 4,063,165 | 12/1977 | Lanz .......................................... | 324/535 |
| 5,138,265 | 8/1992 | Kawamura et al. ...................... | 324/535 |

OTHER PUBLICATIONS

Stringfield et al., Fault Location Methods for Overhead Lines, Transactions of the American Institute of Electrical Engineers, vol. 76, Part III, Aug. 1957, pp. 518–530.

Marihart et al., Automatic Fault Locator for Bonneville Administration, published as Conference Paper, IEEE, PES, Jul. 1972, pp. 1–6.

Ando et al., Development and Field–data Evaluation of Single–End Fault Locator for Two–Terminal HVDC Transmission Lines, Part I: Data Collection System and Field Data, IEEE Transactions on Power and Apparatus Systems, vol. PAS–104, No. 12, Dec. 1985, pp. 3524–3537.

*Primary Examiner*—Diep N. Do
*Attorney, Agent, or Firm*—Pollock, Vande Sande & Amernick

[57] ABSTRACT

A method of measurement for fault distance determination on two or more parallel HVDC lines connected between two stations with a line fault locator is provided. The fault distance determination is performed by determining the difference in time, via synchronous clocks at each station, between travelling waves, which arise when a fault occurs, reach the two stations. The difference in time is determined by measuring the current associated with the travelling waves and detecting the current at the two stations and on each of the parallel connected lines.

3 Claims, 2 Drawing Sheets

METHOD OF MEASUREMENT FOR FAULT-DISTANCE DETERMINATION ON A HVDC POWER TRANSMISSION LINE HAVING AT LEAST TWO LINES CONNECTED IN PARALLEL

TECHNICAL FIELD

The present invention relates to a method for fault determination on a power transmission line, more particularly, a method of measuring current for fault determination on an HVDC power transmission line having at least two lines connected in parallel.

BACKGROUND OF THE INVENTION

When a fault occurs on a power transmission line between two stations, independently of whether it is an ac line or a high-voltage direct current line, that is, a so-called HVDC line, it is of great value to rapidly determine the distance from any or both of the stations to the fault location. For this purpose, so-called line fault locators, known under the generally accepted abbreviation LFL, are provided.

Known methods for such fault-distance determination deal predominantly with fault-distance determination on ac lines. A summary of and a short description of methods and measuring principles for this purpose are given, for example, in an article "Fault Location Methods for Overhead Lines", published in Trans AIEE, 7G (1957), part III, pp. 518–530. This article describes a measuring principle which comprises detection of a fault and evaluation of the distance to the fault as a travelling wave time principle. This measuring principle is also used in connection with the present invention.

When a fault occurs on a line, a transient occurs between the states prior to and after the fault in the form of travelling waves which propagate from the fault, in respective directions, towards the two stations. There are different ways of measuring the propagation times of the travelling waves in order to locate the fault. Since this invention relates to a method of measurement for these travelling waves, the actual evaluation method for the fault-distance determination will be dealt with very briefly.

A very common method, which is described in an article "Automatic Fault Locator for Bonneville Power Administration" by D. J. Marihart and N. W. Haagenson, published as Conference Paper, IEEE, PES, July 1972, is to determine the difference in time between the arrival of the travelling waves at the two stations. With knowledge of this difference in time, it is, in principle, relatively simple to obtain a fault-distance determination. The direct measurement of the difference in time may be performed in different ways, but normally takes place with the aid of synchronized clocks at the two stations. Variants of such determination are also described in U.S. Pat. No. 3,609,533, "Fault Location System for Determining Distance of Fault on a Transmission Line From a Predetermined Position Thereon". During fault-distance determination while determining the time at the two stations, it is sufficient to detect either the voltage or the current which is associated with the travelling waves.

To eliminate the communication between the two stations which is necessary according to the above-mentioned method, the fault-distance determination may also be performed by measuring the travelling wave, or waves reflected by the travelling wave, at only one of the stations. To be able to determine the fault distance, however, this method requires determination of both the current and the voltage which are associated with the travelling wave.

The references and methods mentioned above relate to fault-distance determination on ac lines, where, for measurement of the current and the voltage which are associated with these waves, current and voltage transformers are used.

Using travelling waves for fault determination on dc lines is also possible, and an article entitled "Development and Field-Data Evaluation of Single-End Fault Locator For Two Terminal HVDC Transmission Lines" by M. Nado, E. O. Schweitzer and R. A. Baker, published in IEEE, Vol. Pas-104, No. 12, December 1985, pp. 3524–3537, describes a method for fault-distance determination based on measurement at one station of both the current and the voltage which are associated with both travelling waves and reflected waves. The article shows that measurement of the current is performed via shunt resistances and that the voltage is measured with the aid of "compensated" voltage dividers.

The above-mentioned invention deals with determination of travelling waves on HVDC lines and relates to a method wherein the difference in time is determined between the point where travelling waves from a fault reach the end stations of the line. It is thus assumed that the time determination takes place with synchronous clocks and communication between the two stations. According to the above, this measuring and determination principle means that only the voltage or the current which is associated with the travelling wave is needed for the fault-distance determination.

SUMMARY OF THE INVENTION

A method for fault-distance determination with a line fault locator on an HVDC power transmission line connected between two stations is provided. The HVDC power transmission line has at least two lines connected in parallel. The method is based on the measurement of travelling waves which, at and from a fault, propagate on the HVDC power transmission line in separate directions towards the two stations. The fault-distance determination is accomplished by determining the difference in time between the times that the travelling waves reach the two stations. The difference in time may be obtained via synchronous clocks at each station. In the present invention, the current which is associated with the travelling waves is measured and the current is then detected at the two stations and on each one of the at least two parallel connected transmission lines.

DETAILED DESCRIPTION OF THE INVENTION

Figure 1:
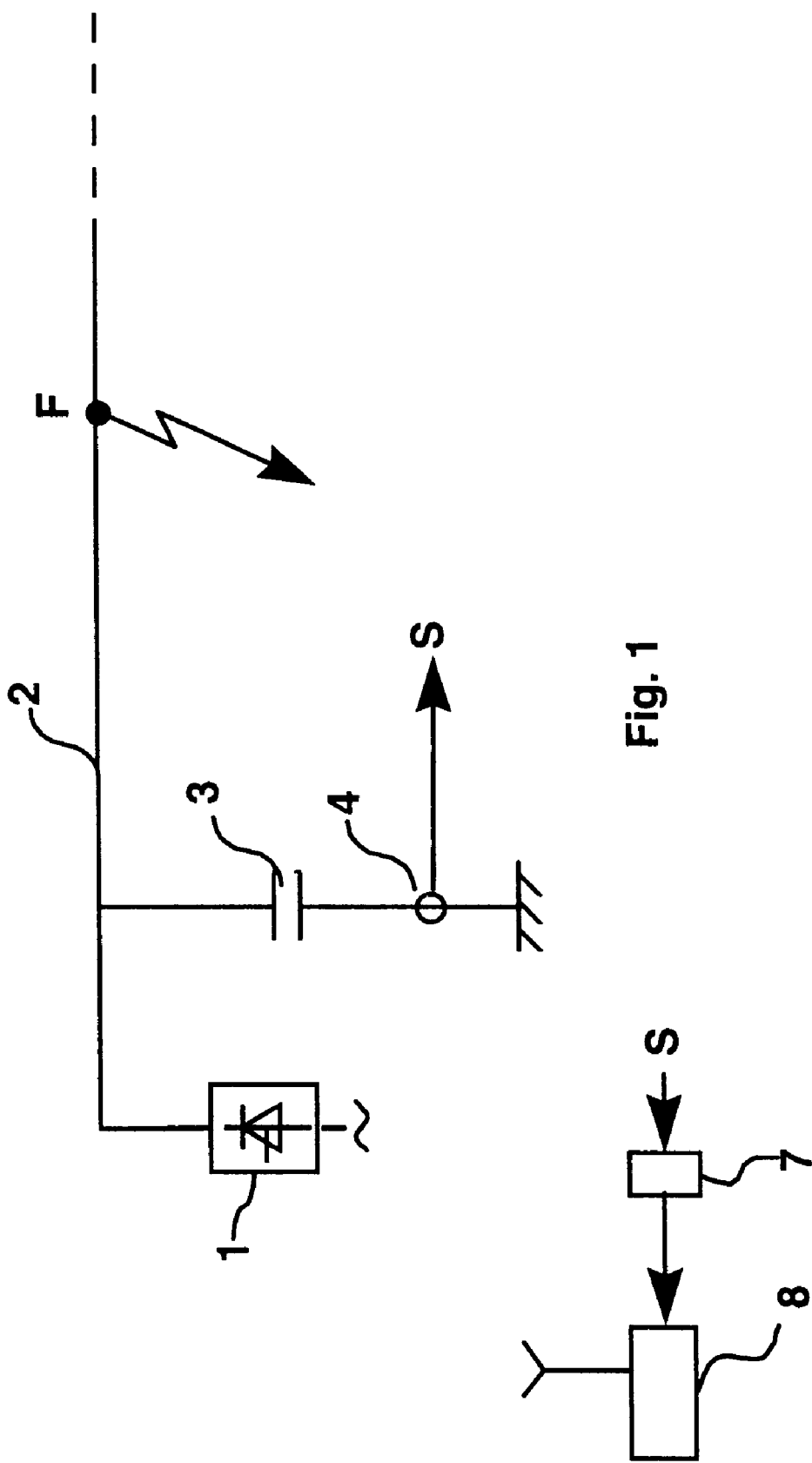
FIG. 1 illustrates a prior art apparatus used for measuring the voltage which is associated with a travelling wave.

One way of indirectly measuring the voltage which is associated with the travelling wave is clear from the prior art and shown in accompanying FIG. 1. A converter station 1 feeds an HVDC line 2 on which a fault has occurred at F. In the station, a capacitor 3 is connected between the HVDC line and ground. For measuring the current through the capacitor, a current pulse transformer 4 is connected between the capacitor and ground. The signal S which is generated in this current pulse transformer thus corresponds to the derivative of the voltage at the travelling wave. With the aid of a corresponding device in the receiver station, i.e., a pulse detecting means 7, and synchronized clocks 8, the difference in time between the arrival of the signals at the stations may be obtained and the fault distance be determined.

Figure 2:
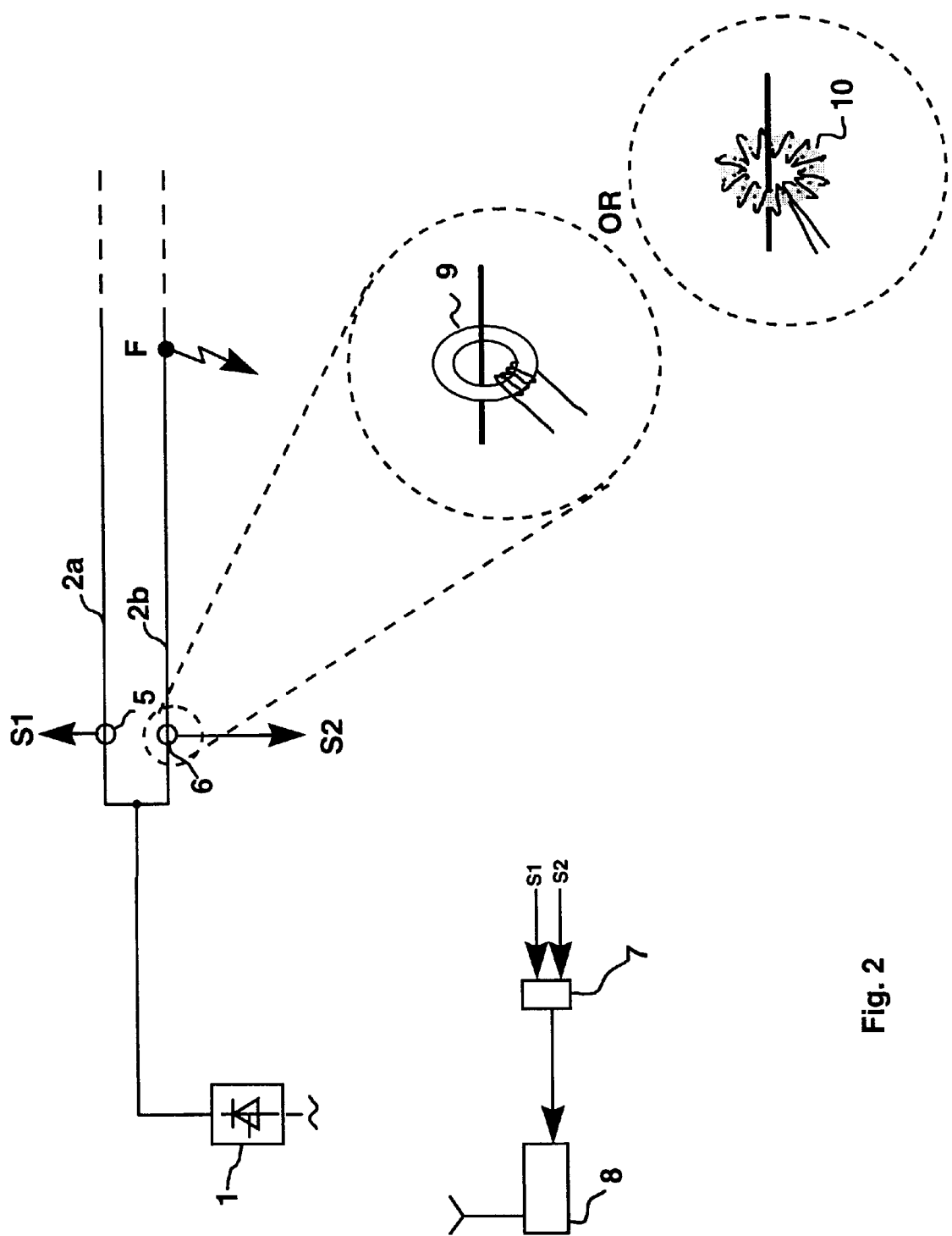
FIG. 2 illustrates an apparatus which can be used to perform the method of the present invention.

In connection with HVDC, it may occur that the power transmission takes place via two or more parallel-connected HVDC lines, exemplified as 2a and 2b in FIG. 2. However, if the same measuring principle of the prior art as shown in FIG. 1 is also used for parallel-connected two- or multi-line transmissions, the measurement would not function due to the fact that the voltage and the voltage derivative, respectively, of the travelling waves would cancel each other across the capacitor since the voltage wave, via capacitive coupling between the lines, will be transmitted on the other line, although with reverse polarity.

To overcome this problem and obtain an adequate measure of the travelling wave, according to the present invention, the current which is associated with the travelling wave is instead determined. Also the current will be transmitted via inductive coupling to the other line, but these two will concur at the points of connection. The current measurement may be performed in different ways, for example according to the method described above via a shunt resistance, with the aid of dc instrument transformers 5 and 6, so-called DCCT9, on each parallel-connected line according to FIG. 2 or via a Rogowski coil 10. Both during current measurement via a shunt resistance and DCCT, the direct current which flows in each line will be continuously measured. To identify the current which is associated with a travelling wave, a filtering is performed such that only signals from the shunt resistance and each DCCT which are considered to originate from a travelling wave, and have a frequency above a certain preset value, are detected for further evaluation of the fault distance. In addition, it is assumed that the line fault protection devices of the lines have identified a line fault.

While a preferred form of the invention has been shown in the drawings and described, since variations in the invention will be apparent to those skilled in the art, the invention should not be construed as limited to the specific form shown and described above.

I claim:

1. A method for fault distance determination with a line fault locator on an HVDC power transmission line between two stations, said HVDC power transmission line having at least two lines connected in parallel, said method comprising the steps of:

measuring a current associated with travelling waves which propagate from a fault on said HVDC transmission line in separate directions towards said two stations;

detecting said current at said two stations;

detecting said current on each one of said at least two parallel lines; and determining the difference between the times said travelling waves reach said two stations via synchronous clocks at each station.

2. A method according to claim 1 wherein said current is detected with a dc transformer.

3. A method according to claim 1 wherein said current is detected with a Rogowski coil.

* * * * *